(12) United States Patent
Jäckel (10) Patent No.: US 12,105,415 B2
(45) Date of Patent: Oct. 1, 2024

(54) METHOD, APPARATUS AND COMPUTER PROGRAM FOR ANALYZING AND/OR PROCESSING OF A MASK FOR LITHOGRAPHY

(71) Applicant: Carl Zeiss SMT GmbH, Oberkochen (DE)

(72) Inventor: Oliver Jäckel, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 560 days.

(21) Appl. No.: 17/398,596

(22) Filed: Aug. 10, 2021

(65) Prior Publication Data

US 2022/0050389 A1 Feb. 17, 2022

(30) Foreign Application Priority Data

Aug. 11, 2020 (DE) .......................... 102020210175.2

(51) Int. Cl.
| | | |
|---|---|---|
| *G03F 1/86* | (2012.01) | |
| *G03F 1/78* | (2012.01) | |
| *H01J 37/28* | (2006.01) | |

(52) U.S. Cl.
CPC .................. *G03F 1/86* (2013.01); *G03F 1/78* (2013.01); *H01J 37/28* (2013.01); *H01J 2237/28* (2013.01); *H01J 2237/31794* (2013.01)

(58) Field of Classification Search
CPC ...... G03F 1/86; G03F 1/78; G03F 1/84; H01J 37/00; H01J 37/02; H01J 37/26; H01J 37/28; H01J 37/261; H01J 2237/28; H01J 2237/31794; H01J 2237/226; H01J 2237/2614; H01J 2237/2817

USPC .......................................... 250/306, 307, 311
See application file for complete search history.

(56) References Cited

U.S. PATENT DOCUMENTS

| | | | | |
|---|---|---|---|---|
| 2007/0102650 | A1* | 5/2007 | Katagiri .................. | H01J 37/18 250/492.1 |
| 2011/0189593 | A1* | 8/2011 | Ogawa ...................... | G03F 1/24 118/712 |
| 2012/0153144 | A1* | 6/2012 | McMorran .............. | H01J 37/28 250/311 |
| 2013/0167665 | A1* | 7/2013 | Niibori ................... | H01L 22/12 73/863.01 |

(Continued)

FOREIGN PATENT DOCUMENTS

DE 102019200696 7/2020

OTHER PUBLICATIONS

Examination Report issued by the German Patent Office for Application No. DE 10 2020 210 175.2, dated Mar. 19, 2021 (with Machine Translation).

(Continued)

*Primary Examiner* — Jason L McCormack
(74) *Attorney, Agent, or Firm* — Fish & Richardson P.C.

(57) ABSTRACT

The present invention relates to a method, an apparatus and a computer program for analyzing and/or processing of a mask for lithography, in particular a mask for EUV lithography.
A method for analyzing and/or processing of a mask for lithography, in particular a mask for EUV lithography, is described, which method comprises the following steps: 1a.) generating at least one particle beam vortex; and 1b.) using the particle beam vortex for analyzing and/or processing of the mask.

28 Claims, 4 Drawing Sheets

(56) References Cited

U.S. PATENT DOCUMENTS

| | | | | |
|---|---|---|---|---|
| 2013/0193322 | A1* | 8/2013 | Blackburn | H01J 37/26 250/311 |
| 2014/0224988 | A1* | 8/2014 | Tamaki | H01J 37/26 250/311 |
| 2014/0346353 | A1 | 11/2014 | Verbeeck et al. | |
| 2016/0247661 | A1* | 8/2016 | Plachinda | H01J 37/20 |
| 2020/0233299 | A1 | 7/2020 | Budach et al. | |

OTHER PUBLICATIONS

Schattschneider, P. et al., "Transmissions-Elektronenmikroskopie mit Elektronenwirbeln. Ein Whirlpool aus Elektronen", *Phys. Unserer Zeit*, pp. 22-28 (Jan. 2018) from Internet address https://doi.org/10,1002/piuz.201801425 (with Machine Translation).

\* cited by examiner

METHOD, APPARATUS AND COMPUTER PROGRAM FOR ANALYZING AND/OR PROCESSING OF A MASK FOR LITHOGRAPHY

CROSS-REFERENCE TO RELATED APPLICATION

This application claims priority under 35 U.S.C. § 119 from German Application No. 10 2020 210 175.2, filed on Aug. 11, 2020, the content of which is incorporated herein by reference in its entirety.

TECHNICAL FIELD

The present invention relates to a method, an apparatus and a computer program for analyzing and/or processing of a mask for lithography, in particular a mask for EUV lithography.

BACKGROUND

For the production of a lithography mask (in the technical jargon and hereinafter often also simply called "mask" or "reticle"), design structures are transferred to the mask e.g. by electron beam writing. In order to control this process, after the writing process, typically a measurement variable called "registration" is considered, which describes the lateral position deviation of the structure position produced from the position envisaged by the mask design.

In the course of the constant reduction of the structure sizes in chip production, the structures on the masks used for producing them are also being continuously reduced and are currently below the resolution limit of equipment operating in the DUV range (abbreviation of "deep ultraviolet," i.e. in the range of wavelengths of 193 nm). Therefore, there is a need for new imaging methods for example for process control in the course of mask production. Electron beam-based methods, in particular, are suitable for this purpose since they can make available a corresponding lateral resolution (on account of the typically shorter de Broglie wavelength of the electrons in comparison with light). Since the structures of a mask are normally situated on a solid quartz plate, primarily scanning electron microscopy methods employing scanning are appropriate for this. In this case, an electron beam is scanned over the sample and the secondary electrons generated at the sample are detected. In this case, the achievable resolution of the image corresponds to the smallness of the focal spot of the electron beam, and the achievable accuracy of the position information with regard to the examined structures corresponds to the accurate knowledge of the position of the beam on the sample.

These methods thus require as accurate knowledge as possible of the position of the electron beam on the sample, i.e. here on the mask, since it determines the measurement accuracy during imaging. During generation and beam shaping/focusing, however, the position of the electron beam is subject to residual fluctuations and drifts of the order of magnitude of the desired measurement resolution: position accuracies in the sub-nanometer range down to a few 10 pm are the aim in this case as far as the structures becoming ever smaller in modern masks as discussed here are concerned.

SUMMARY

In general, the present invention includes specifying a method which offers an increased accuracy in analyzing and/or processing of modern masks. Furthermore, the accuracy of the method or the deviation thereof from a target value in this regard is intended to be checkable and if possible re-adjustable. Furthermore, a corresponding apparatus and a computer program with instructions for carrying out such a method are intended to be provided.

The aforementioned features are at least partly achieved by the various aspects of the present invention, as described below.

In one embodiment, a method for analyzing and/or processing a mask for lithography, in particular a mask for EUV lithography, comprises the following steps: (1a.) Generating at least one particle beam vortex; and (1b.) Using the particle beam vortex for analyzing and/or processing of the mask.

The generation of a particle beam vortex (also called "particle beam whirlpool" or the like) in particular an electron beam vortex, is known in principle and described in the following overview article: Schattschneider P., Schachinger T. and Verbeck J., *"Transmissions-Elektronenmikroskopie mit Elektronenwirbeln. Ein Whirlpool aus Elektronen"* ["Transmission electron microscopy with electron vortices. A whirlpool of electrons"], Phys. Unserer Zeit, 1/2018 (49), retrievable from the Internet address https://doi.org/10.1002/piuz.201801495. In connection with the measures necessary for generating a particle beam vortex (or a plurality of particle beam vortices), reference is therefore made explicitly to this article.

It should furthermore be mentioned as early as at this juncture that the use of a particle beam vortex (or a plurality of particle beam vortices) for analyzing and/or processing of a mask as such already constitutes an independent aspect of the present disclosure, independently of the generation of the particle beam vortex and the details in this regard. For this aspect concerning the use of a particle beam vortex for analyzing and/or processing of a mask, the possibilities and options set out hereinafter are also applicable—unless of course they relate precisely to the generation of the particle beam vortex, or such a combination is impeded by other technical or physical laws.

A particle beam vortex is a solution $\Psi$ of the Schrödinger equation which can be described (approximately) for example in cylindrical coordinates (r, φ, z) in the following form:

$$\Psi(r,\varphi,z) = a(r)e^{-il\varphi}e^{ikz} \qquad \text{(Equ. 1)}$$

In this case, a(r) is a function dependent only on the radial coordinate r, l is the so-called number of turns of the solution considered, and k is the wavevector in the direction of propagation of the wave, which is in the direction of the z-axis in this form of the solution (for an individual vortex with a different direction of propagation, the form of the solution chosen here can always be re-established by a suitable rotation of the coordinate system). The number of turns l is also called the "order" or "topological charge" of the solution and for a mathematical solution of the above form with number of turns l the following holds true with regard to its orbital angular momentum $$\langle L_z \rangle = l\hbar \qquad \text{(Equ. 2)}$$

Figure 1A:
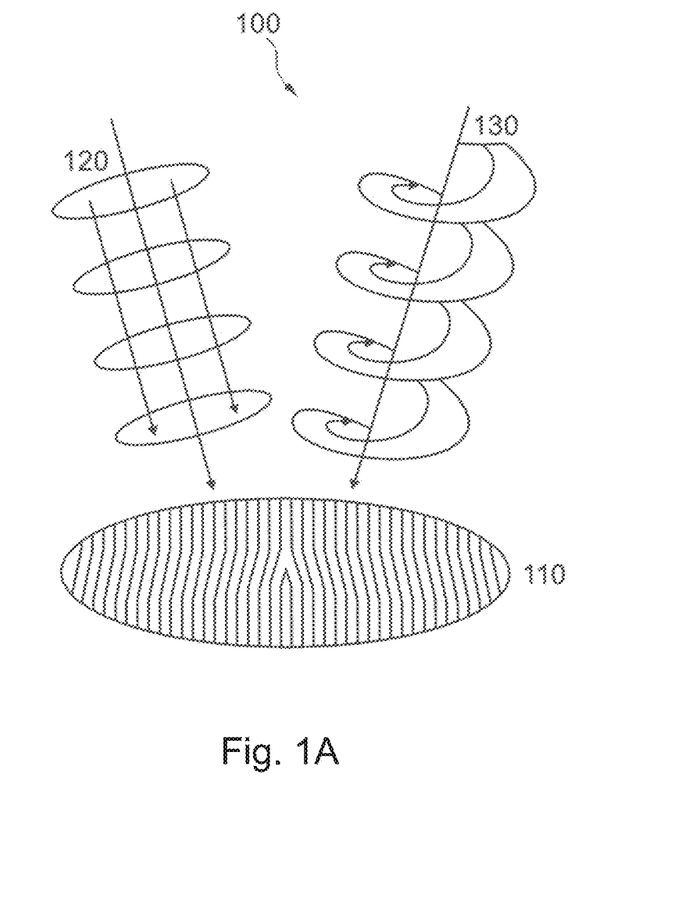
FIGS. 1A-1C show fundamental details concerning the generation of electron beam vortices, as known from the prior art (cf. Schattschneider P., et al.; Phys. Unserer Zeit, 1/2018 (49))
Figure 1B:
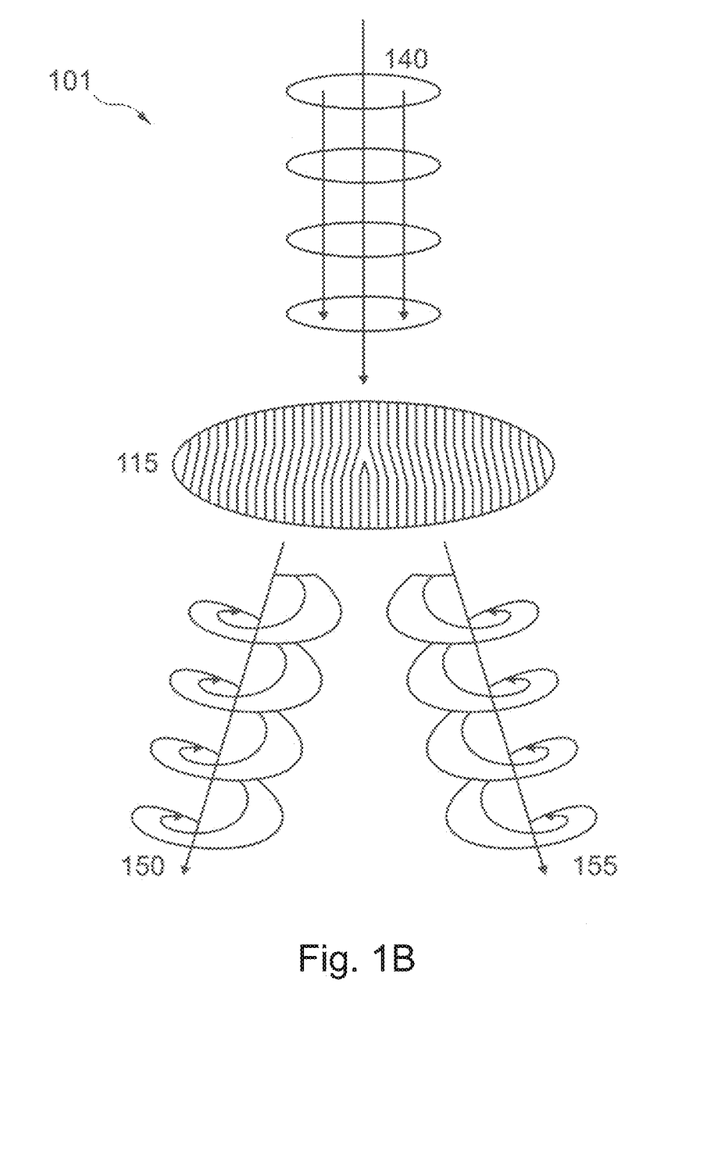
Figures 1C, 2:
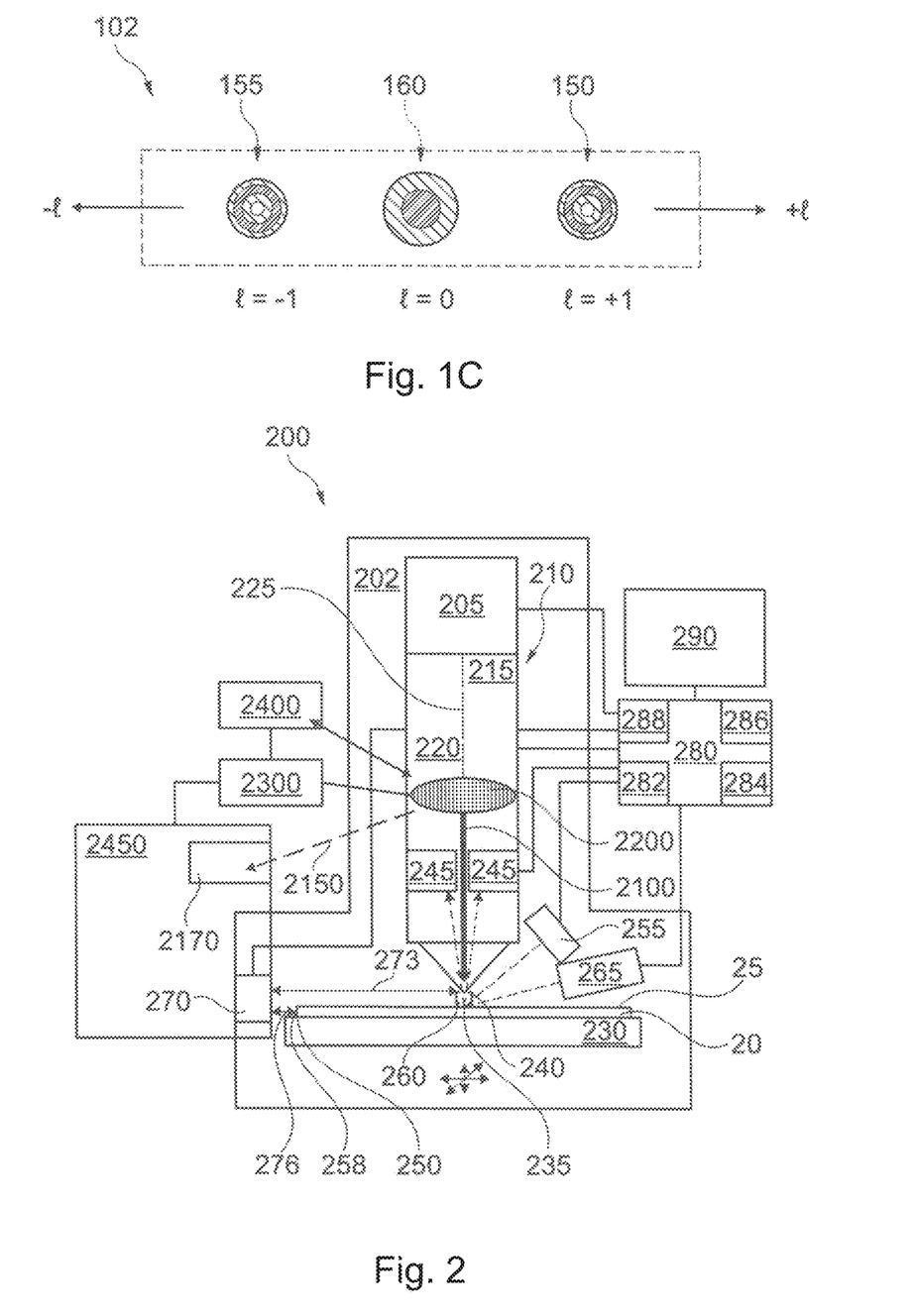
FIG. 2 schematically shows in section some components of an apparatus according to the present invention for analyzing a mask.

One advantage of the use of such a particle beam vortex in the context for analyzing and/or processing of a mask, in particular a mask for EUV lithography with correspondingly small structural dimensions, is that at least for values l≠0 (i.e. for solutions which also actually have a vortex character) the wavefunction in the center of the vortex, i.e. at r=0, has a pronounced minimum surrounded by a ring-shaped maximum (further details in this respect will also be described further below with reference to FIGS. 1A to 1C). To put it another way, the vortex structure causes a kind of intrinsic focusing of the beam (e.g. in the sense of an intensity redistribution or local focusing of the intensity distribution in specific regions), which advantageously finds application in the context of the method described herein during analyzing and/or processing masks and can counteract, e.g. the fluctuations and drifts mentioned in the introduction. Consequently, the susceptibility of the method to defocusing effects and "blur effects" can increase as a result of the use of the particle beam vortex compared with conventional particle beam-based methods. This can improve the resolution capability achievable in practice, for example.

The use of the particle beam vortex for analyzing and/or processing of the mask in step 1b. can be manifested in a variety of ways here (in this respect, also cf. even further below). In principle, using the particle beam vortex can comprise directing the latter at a corresponding location or a corresponding region of the mask or, conversely, generating the particle beam vortex and/or positioning the mask relative to the latter in such a way that the vortex is aimed at the intended location or the intended region. The particle beam vortex aligned in this way can then be used for example for the registration measurement of a mask structure present and/or for writing a structure (edge) to the mask. The resolution and/or precision of the measurement and/or writing can thus be increased.

Generating the at least one particle beam vortex can comprise a particle beam passing through a spiral plate. In this case, the particle beam can be, e.g., a particle beam such as is used by known apparatuses for analyzing and/or processing of masks, such as are also sold by the applicant. Further details concerning possible embodiments of apparatuses for implementing the method described here, in particular for positioning the spiral plate discussed here in the beam path of the apparatus, will follow further below.

The use of a spiral plate in the manner described here, i.e. in transmission with a particle beam, entails advantages specific for analyzing and/or processing of modern masks. In this regard, fluctuations of the particle beam vortex can be coupled to the position and orientation of the spiral plate and can therefore be alleviated or compensated for by (mechanical) manipulation of the spiral plate.

This is based on the fact that the spiral plate can generate the vortex beam in a defined direction with respect to the direction of the normal to the plate (generally this direction is dependent, inter alia, on the number of turns l of the vortex) and thus both the position and the direction of the particle beam vortex will be dependent on the position and orientation (e.g. in the sense of the normal vector of the spiral plate at the point at which the vortex is emitted) of the spiral plate. To put it more precisely, the intensity distribution of the vortex here typically corresponds to a donut or a ring with a zero in the center (at least for $l \neq 0$), and the position of this intensity zero results from the orientation and the position of the spiral plate and the direction of propagation of the particle beam vortex, wherein the latter will also be influenced by the position and orientation of the spiral plate besides the k-vector of the particle beam impinging on the spiral plate (this sometimes being referred to as "primary beam" hereinafter).

In summary, therefore, the particle beam intensity and/or the beam profile can be coupled to the mechanical stability of the spiral plate, and the monitoring/observation thereof can therefore serve for influencing the beam profile. This constitutes an improvement vis-à-vis the variant typically employed hitherto, in which only a simple stop is used as position manipulator. By contrast, now with a particle beam vortex coupled to a spiral plate, position deviations and drifts and also beam direction deviations and drifts which arise as a result of the particle beam generation and shaping can be manipulated and even positively influenced by a mechanical component, namely the spiral plate.

For this purpose, the spiral plate can be introduced into the particle beam in an adjustable manner. In this case, adjustable can mean in particular that the position and/or orientation of the spiral plate are/is variable, e.g. measured relative to the apparatus in which the method proceeds, in particular relative to the k-vector of the incident particle beam ("primary beam"), and/or relative to the position of the mask to be examined/processed.

It should be mentioned that it is also conceivable, in principle, for the spiral plate to be introduced or mounted in the beam path fixedly, i.e. without the possibility of subsequent position/location alteration, e.g. in order that the apparatus provided for carrying out the method is simplified in terms of its set-up or is made more robust. In this case, the situation would possibly still be such that an "implicit" adjustability is present in the sense that, e.g., the position of the mask and/or the position or beam axis of the incident primary beam can be readjusted relative to the spiral plate. Nevertheless, a fixedly mounted spiral plate would mean that some of the options and advantages described below would possibly have to be dispensed with.

The method described can comprise in particular a dynamic adjustment of the spiral plate.

In this context, "dynamic" can mean that the adjustment was not exclusively concluded before analyzing/processing of the mask is carried out, rather that an adjustment is also effected during analyzing/processing of the mask. This adjustment can happen once during analyzing/processing, or at a plurality of points in time during analyzing/processing, e.g. periodically in each case after a specific time interval or aperiodically or after variable time intervals. Alternatively, the dynamic adjustment is effected continuously, at least for a certain period of time. Mixed forms are likewise conceivable and the dynamic adjustment can furthermore be switched on or switched off (manually or automatically).

The adjustment can be effected for example by way of suitable mechanical means, e.g. piezoelectric elements or the like, which can adapt the position and/or orientation of the spiral plate in the beam path of the particle beam (e.g. relative to the k-vector of the primary beam). Alternatively or additionally, it is possible, e.g., also to adapt the beam path of the particle beam itself and/or the focusing setting of same in relation to the spiral plate in order to achieve an even better alignment of the particle beam vortex with the desired mask point/mask region.

The method can comprise determining a position of the spiral plate.

As already mentioned, one advantage of the use of a particle beam vortex is that the latter's position and stability and the position of a spiral plate that generates said vortex can be coupled. By monitoring and/or determining the position of the spiral plate, it is then possible to obtain information about the particle beam vortex, e.g. with regard to the stability and position of the minimum at the center of the particle beam vortex. This information can in turn be used to improve the achievable spatial resolution that can be attained with the particle beam vortex for analyzing/processing of the mask, e.g. by fluctuations in the position of the spiral plate—and thus of the particle beam vortex—being computationally extracted or compensated for.

The adjustment of the spiral plate can be coupled to one or more correction variables, in particular to the position of the spiral plate.

One example, namely that the position of the spiral plate is used as a correction variable and, e.g., fluctuations of the same are compensated for, has already been discussed. However, additionally or alternatively, further correction variables are also conceivable. In particular, consideration can be given to correction variables which do not concern the spiral plate as such, but rather, e.g., the intensity, the (cross-sectional) profile, the position, etc. of the particle beam vortex at a specific reference position and/or directly on the mask surface. Since, as already mentioned a number of times, the particle beam vortex, in terms of its form and orientation, is coupled to the spiral plate at least to a certain extent, these parameters can likewise yield information about the position and/or orientation of the plate, and thus allow a (re)adjustment of same. Such "indirect" indications can furthermore be compared with the "direct" position data with regard to the spiral plate position in order to check its correspondence or to determine an average value of the data from the various information sources, or something similar, which can result in a better final accuracy.

The adjustment of the spiral plate can comprise tracking the spiral plate, for example.

If, for example by direct measurement of the position of the spiral plate or else by observation of the position of the particle beam vortex (e.g., defined by the position of the minimum at the center thereof) or by a combination of these possibilities, it is established that the position of the plate and/or of the vortex "travels", then the position and/or orientation of the spiral plate can be tracked to this change in order to compensate for the change and to keep the vortex stable. This can be effected step by step, i.e. in discrete adjustment steps (e.g., at periodic or aperiodic time intervals), or can comprise continuous tracking.

The adjustment of the spiral plate can also comprise a correction of a distortion aberration.

Besides the position and orientation of the spiral plate, generally other properties of the imaging optical unit/beam shaping optical unit of the apparatus used for carrying out the method described will also have effects on the intensity, the (cross-sectional) profile, the position, etc. of the particle beam vortex. This means that by adapting one (position and orientation of the spiral plate), aberrations of the other (imaging optical unit/beam shaping optical unit) can be compensated for—at least within certain limits. In concrete terms, distortion aberrations in the optical unit of the apparatus can be compensated for, e.g., by adjustment of the spiral plate.

The adjustment of the spiral plate can furthermore comprise a decoupling of a constant drift.

Compared with the above-mentioned possibility of tracking, which can be regarded as a "direct" variant of the adjustment, i.e. as a variant in which, e.g., drifting away of the spiral plate or of the particle beam vortex or of the mask or the like is observed and accordingly readjusted (optionally by way of a feedback loop), the decoupling of a constant drift as mentioned here can be regarded as it were as an "indirect" variant. By way of example, the mask can have a specific temperature settling behavior under which it shrinks or expands. If this behavior is predictable (at least to a certain degree), such effects can be compensated for "proactively" by use of a corresponding adjustment of the spiral phase plate, even without this effect necessarily having to be observed directly. In this case, the adjustment can proceed according to a predetermined plan (i.e., not by way of a feedback loop), which can be obtained or derived precisely from the predicted behavior of the mask.

The spiral plate can operate according to the principle of holographic stops.

In this case, in a computer, for example, the particle beam vortex to be generated is superposed with a plane reference wave, a hologram is calculated from the superposition of the two and then a corresponding spiral plate is accordingly produced. In order to produce the actual particle beam vortex (cf. step 1b.), the spiral plate is then illuminated with a plane reference wave, which results in the generation of the particle beam vortex. For further details concerning this principle, reference is made again to the article by Schattschneider P., Schachinger T. and Verbeck J., "*Transmissions—Elektronenmikroskopie mit Elektronenwirbeln. Ein Whirlpool aus Elektronen,*" Phys. Unserer Zeit, 1/2018 (49), mentioned in the introduction. One advantage of this construction of the spiral plate is that such a spiral plate can be integrated into existing particle beam optical units without major conversion measures, since said optical units are generally already configured to be able to generate a plane particle wave.

The spiral plate can comprise an amplitude mask or be embodied as such.

By way of example, the spiral plate can be used as a binary grating with a discontinuity in transmission in order to generate particle beam vortices upon illumination with a plane particle wave or with a corresponding particle beam ("primary beam") in one or more orders of diffraction. Such a grating can have for example an area from a few micrometers up to a few 10 micrometers and a grating constant of a few hundred nanometers. The typical ridge width can likewise be in the range of a few to a few hundred nanometers. In order to avoid "sagging" of the ridges or other instabilities for the given geometric grating parameters, transverse ridges for stabilization can additionally be introduced into the design. Said transverse ridges, given a suitable choice of the transverse ridge width (e.g., a transverse ridge width similar to the main ridge width), can furthermore provide for extinguishing the even orders of diffraction. This results in higher intensities in the individual orders of diffraction compared with when all orders of diffraction are excited. The use of transverse ridges can therefore increase both the stability of the spiral plate used and the efficiency thereof during vortex generation. Further measures—called "blaze-like" in the technical jargon—for increasing the efficiency of the plate are likewise conceivable (in this case, in simple terms, a skillful choice of the thickness profile of the material of the plate results in the intensity of the incident beam being focused for the most part into a single vortex).

The spiral plate can additionally comprise a phase mask or be embodied as such.

For this purpose, with the use of an electron beam, for example, electron-transparent materials can be stacked circularly and with increasing thickness around a cylinder axis (corresponding to the direction of propagation z of the electron beam vortex) with nanometer accuracy according to the desired phase shift of $2\pi*l$ in the case of whole-number revolutions around the cylinder axis. When this plate is illuminated with a plane electron beam, an electron beam vortex with a corresponding charge number l is generated and is available for the application, e.g., in a scanning electron microscope. A disadvantage of such phase masks is that currently from a technological standpoint they are still very complex to fabricate and are additionally susceptible to contaminations. An advantage, on the other hand, is that they generally "swallow" less intensity than, e.g., the binary amplitude masks described above, which block part of the incident intensity completely from transmission.

The various possibilities mentioned here for designing the spiral plate can also be combined with one another, such that a spiral plate used with the method disclosed herein can have, e.g., a region or regions embodied as amplitude mask, and a region or regions embodied as phase mask.

Finally in regard to this topic, for the sake of completeness, reference is again made to the article by Schattschneider P., Schachinger T. and Verbeck J., "*Transmissions-Elektronenmikroskopie mit Elektronenwirbeln. Ein Whirlpool aus Elektronen*," Phys. Unserer Zeit, 1/2018 (49), mentioned in the introduction, where further details can be found regarding the design of binary masks and phase masks.

The method can comprise providing the particle beam by use of a scanning beam microscope, that is to say that the particle beam can be part of a scanning beam microscope.

As already mentioned, such microscopes are technically very mature and particularly suitable especially for the examination of modern EUV masks, and so on the basis thereof the advantageous effects of the use of particle beam whirlpools can be manifested particularly well.

Generating the at least one particle beam vortex (cf. step 1a.) can furthermore comprise generating at least one pair of particle beam vortices, wherein a first particle beam vortex of the pair is used for analyzing and/or processing of the mask (cf. step 1b.), and wherein the other, second particle beam vortex of the pair is guided to a detector.

Suitable detectors for detecting the second particle beam vortex are known to the person skilled in the art. In this case, the detector can supply information regarding various properties and characteristics of the second particle beam vortex such as, for example, the latter's position, (cross-sectional) profile, intensity. Since both the first particle beam vortex and the second particle beam vortex are preferably generated from the same primary beam, there may exist a certain correlation (wherein "correlation" here should not necessarily be understood as quantum mechanical entanglement) between the two vortices, and so from the properties of the second vortex conclusions can be drawn about the properties, in particular the corresponding properties, of the first vortex, which actually serves for analyzing and/or processing of the mask. This can be advantageous since the detector can be spatially separated from the mask, such that the mask and the detector do not "get in each other's way," but it is nevertheless possible for the proceeding process to be monitored in parallel with the processing/analysis, which monitoring does not interrupt or otherwise adversely affect the processing/analysis.

The method can comprise using the second particle beam vortex of the pair as stability reference and/or position reference.

As already described above, in particular when using a spiral plate in transmission, the vortex generated can be "mechanically" coupled to the plate and for example drifts or fluctuations in the vortex position can be compensated for by influencing the position of the spiral plate. If, besides the vortex serving for processing/analyzing, a second vortex is then generated pairwise with the first, in particular in a correlated manner, e.g., from a common primary beam, then from the stability and/or position thereof it is possible to deduce what the situation is with the stability and/or position of the first vortex and, if necessary, to take suitable measures (e.g., a readjustment of the spiral plate) in order to achieve the desired stability and/or position of the processing or analyzing vortex.

It is possible, particularly when generating the pair from a primary beam, for the two particle beam vortices to form a pair with numbers of turns (l, −l) having the same absolute value but different signs.

If, for example, a spiral plate constructed as an amplitude mask as described above is used in transmission for the generation, then such a pair can be generated in the l-th order of diffraction, one vortex being generated in order of diffraction +l, and the other in order of diffraction −l. Such a symmetrical pair of particle beam vortices can therefore be particularly advantageous since here the properties of one vortex can correspond to the corresponding properties of the other vortex particularly well, and so it can be possible to use one vortex for monitoring, supervising and controlling the other vortex particularly well.

It should be explicitly mentioned at this juncture that the use of a pair of particle beams, as just described and as described even further below, is also conceivable, in principle, for beams without a vortex character (e.g., for a beam pair that is generated at a simple optical grating) and constitutes an independent part of the present disclosure, even if in this case, e.g., the advantage associated with the intensity zero at the center of the vortex beams described herein would be lost.

Returning to the possibilities already touched on briefly above regarding the use of the particle beam vortex for analyzing and/or processing of the mask (cf. step 1b.), the particle beam vortex can be used for a measurement in which a deviation of a position of a structure on the mask from an intended position of the structure on the mask is ascertained (i.e., for a registration measurement).

This is taken into consideration particularly if the method serves for process control during mask production.

What can be manifested particularly advantageously in this case is that the method described provides both a high "intrinsic" resolution capability in the form of the intensity distribution within the particle beam vortex with a local minimum at the center and a high position stability and position knowledge with regard to the vortex, e.g., by use of a suitable dynamic adjustment of the spiral plate and/or by monitoring by way of a second reference vortex generated pairwise. As explained in the introduction, both are of great importance in process control for the mask production of modern (EUV) masks in order to achieve the desired and necessarily spatial resolution of the mask features and structures examined.

Alternatively or additionally, the particle beam vortex can also be used for particle beam writing of a structure to the mask.

Such a writing process typically includes a particle beam-induced etching or deposition reaction and in order to produce extremely fine structures and features, as is striven for nowadays, a good position stability and knowledge is indispensable here, too, in order to obtain the desired results. Precisely in the case of such processing processes, the use of a second reference vortex that is separate but generated pairwise can furthermore be advantageous since this can be guided away from the reaction location and can function as a monitoring beam without influencing the etching or deposition reaction. The processing and monitoring process can thus be separated in terms of process engineering and spatially at least within certain limits, which can constitute a great simplification both structurally and in terms of control engineering.

As already mentioned a number of times, in all embodiments and variants described herein, the particles can be electrons, and an apparatus provided for carrying out the method can be based on a scanning electron microscope, for example. Besides the fact that such apparatuses are already available in highly developed form and are well suited to the purposes striven for here, a further advantage of the use of electrons is that their de Broglie wavelength at the energies typically used lies in a range which technically allows the vortex generation, e.g., by use of amplitude and/or phase masks (already) at the present time.

In principle, however, the use of other types of particles, such as ions, for example, is not excluded either. Photons, too, are conceivable as particles.

Ions typically have a higher penetration depth than electrons and can therefore be used for example if examinations of layers far from the surface are desired (the secondary electron signal generated by the ions will then, e.g., generally originate from deeper layers than in the case where electrons are used).

A further aspect of the present invention is constituted by a computer program comprising instructions which, when executed, cause an apparatus for analyzing and/or processing of a lithography mask to carry out the steps of an embodiment of the method described herein.

Yet another aspect of the present invention is constituted by an apparatus for analyzing and/or processing of a mask for lithography, in particular a mask for EUV lithography, which apparatus is configured to carry out an embodiment of the method described herein.

In the context both of such a computer program and of such an apparatus, the various options and possibilities for configuration of the method described can be combined with one another in so far as is technically and physically possible, even if the corresponding combination is not explicitly discussed herein. Moreover, individual features or sub-features can also be omitted provided that they are dispensable in respect of achieving an intended result. In this regard, it is pointed out again that in particular the use of a particle beam vortex for processing/analyzing of a mask constitutes an independent aspect of the present invention and disclosure which can be used independently of details concerning the generation of the vortex, and can therefore form the basis of a claim.

Such an apparatus for analyzing and/or processing of a mask for lithography, in particular a mask for EUV lithography, can comprise for example means for generating at least one particle beam vortex and means for using the particle beam vortex for analyzing and/or processing of the mask.

Such an apparatus, as already mentioned, can in principle be based on known and already existing apparatuses such as are known for analyzing or processing of masks. By way of example, the apparatus could be based on one of the apparatuses sold by the applicant for this purpose.

Unlike the known apparatuses, however, the apparatus according to the invention operates with particle beam vortices rather than with conventional particle beams, with the attendant specific advantages described above.

The means for generating the at least one particle beam vortex can comprise a spiral plate, in particular, which is introduced into a particle beam.

As mentioned above, the use of a spiral plate has the effect that the stability and position of the vortex (within certain limits) are coupled to the stability and position of the spiral plate, i.e. to a mechanical component of the apparatus, and can thus be aimed at directly by way of influencing said mechanical component. Compared with conventional stops, for example, this can result in significantly improved control and thus ultimately in an increased accuracy of analyzing/processing process of the mask.

In addition to the spiral plate, the apparatus will generally have even further components appertaining to geometric optics, serving for the generation and beam shaping of the primary beam (i.e., of the particle beam which impinges on the spiral plate), as will also be presented by way of example in the detailed description that follows below.

The apparatus can furthermore comprise means for the dynamic adjustment of the spiral plate.

The meaning of the word "dynamic" in this context has already been discussed. Since the use of a spiral plate, as explained above, allows the stability and position of the particle beam vortex to be coupled to a mechanical component—namely the spiral plate, mechanically acting means can likewise be used for the adjustment of the spiral plate and thus ultimately of the particle beam vortex itself. By way of example, use can be made of one or more piezoelectric elements that influence the position and/or orientation (e.g., in the sense of the normal vector of the spiral plate at the point at which the vortex emanates from the plate) of the spiral plate.

In order to enable and to control the dynamic adjustment of the spiral plate, the apparatus can comprise means for ascertaining one or more correction variables, in particular means for ascertaining a position of the spiral plate, wherein the means for the dynamic adjustment of the spiral plate are coupled to the means for ascertaining.

The means for ascertaining the characteristic variable(s), including the position, can comprise sensors or detectors known per se for this purpose, that is to say, e.g., position sensors (e.g., sensors that operate by use of interferometry, etc.), intensity sensors, sensors that measure or reproduce a particle beam profile, etc. These can for example be in a feedback loop with the means for adjustment and can thus bring about a continuous adjustment of the spiral plate (optionally including suitable analyzing means), or the data of these sensors can be sampled at specific (periodic or aperiodic) time intervals (and the adjustment can be effected, e.g., at corresponding time intervals), etc.

The means for generating at least one particle beam vortex can furthermore comprise means for generating at least one pair of particle beam vortices, wherein a first particle beam vortex of the pair of particle beam vortices is used by the already mentioned means for analyzing and/or processing of the mask, and wherein the apparatus comprises further means for using the other, second particle beam vortex of the pair of particle beam vortices as stability reference and/or position reference, in particular a detector to which the second particle beam vortex is guided. It is also possible for the position of the spiral plate to be ascertained thereby.

In one embodiment, a spiral plate as described herein provides means for generating the pair of particle beam vortices since said spiral plate can generate from a primary beam a pair of vortices with numbers of turns (1, −1) having the same absolute value but different signs.

However, the pair of particle beam vortices can also consist of two vortices that do not have the same number of turns. For example, the pair could be formed by two vortices which originate from different orders of diffraction of a spiral plate designed as an amplitude mask. For this purpose, the means for generating the pair could have a stop function, for example, by which the unrequired or undesired orders of diffraction can be masked out. Optionally, it is even possible to switch between the different orders in this case.

In principle, the pair could also be generated from separate primary beams, although in that case a certain amount of usable information would be lost since the correlation of the two vortices would be lost or at least weakened, and the set-up in terms of design would also generally become more complicated.

The already discussed means for analyzing and/or processing of the mask can comprise means for a measurement in which a deviation of a position of a structure on the mask from an intended position of the structure on the mask is ascertained.

In other words, the apparatus can be used for registration measurement. Means for carrying out such measurements are known in principle to the person skilled in the art, e.g. one or more detectors measuring secondary electrons backscattered from the mask, in order to derive therefrom information about the measured structure. The present apparatus can be based on such means, but with the proviso that now a particle beam vortex, instead of a conventional particle beam, is used for scanning the structure, with the advantageous effects already described above, in particular the possibility of an improved spatial resolution and beam stability at the measurement location.

The means for analyzing and/or processing of the mask can alternatively or additionally also comprise means for particle beam writing of a structure to the mask.

Such means are likewise known in principle to the person skilled in the art, e.g. one or more gas reservoirs with corresponding feed lines to the reaction location in order to carry out a particle beam-induced etching or deposition process. The present apparatus can again be based on such means, with the proviso that now a particle beam vortex is used instead of a conventional particle beam, once again with the advantageous effects associated with this.

Finally, it should be pointed out again that the particles can be electrons, in particular. In this case, the apparatus can be embodied as a scanning electron microscope or can be based on or comprise such a microscope, with the advantages already mentioned above in this regard.

BRIEF DESCRIPTION OF DRAWINGS

The following detailed description describes possible embodiments of the invention, with reference being made to the figures, wherein.

DETAILED DESCRIPTION

Embodiments of the present invention are described below primarily with reference to the analysis of a mask for EUV lithography. However, the invention is not restricted thereto and it can also be used for other types of masks and also for other processes, in particular for the processing and/or production of lithography masks.

Furthermore, it is pointed out that only individual embodiments of the invention may be described in more detail below. However, a person skilled in the art will appreciate that the features and modification options described in association with these embodiments can also be modified even further and/or can be combined with one another in other combinations or sub-combination without this leading away from the scope of the present invention. Moreover, individual features or sub-features can also be omitted provided that they are dispensable in respect of achieving the intended result. In order to avoid unnecessary repetition, reference is therefore made to the remarks and explanations in the preceding sections, which also retain their validity for the detailed description which now follows below.

FIGS. 1A to 1C show fundamental details concerning the generation of electron beam vortices, as known from the prior art (cf. the article by Schattschneider P., et al.; Phys. Unserer Zeit, 1/2018 (49), already mentioned a number of times). In this case, only some aspects which are of particular relevance to the present disclosure will be touched on this juncture. For further background and scientific details, reference is therefore made to the cited publication, and the content thereof, as far as the generation and properties of the particle beam vortices described therein are concerned, is hereby incorporated as part of the present disclosure.

FIG. 1A illustrates a process 100 for ascertaining a hologram 110 of a particle beam vortex, i.e. what is also referred to as the "holographic principle" herein. For this purpose, e.g. in a numerical computer simulation, a plane reference wave 120 is superposed with the particle beam vortex 130 to be generated. This superposition is used to calculate the hologram 110, for example as a section through the superposition of the two (hypothetical, i.e. simulated in the computer) waves 120 and 130 along a certain plane.

FIG. 1B illustrates the generation 101 of a real vortex, i.e. a vortex existing as an actual particle stream, from the hologram 110. For this purpose, the hologram 110 is firstly transformed into a corresponding spiral plate 115, which is represented as an amplitude mask in binary form in FIG. 1B, i.e. the mask consists of ridges and intervening gaps arranged in a pattern corresponding to the hologram 110. This is only one possibility, however, and the spiral plate 115 could also be embodied as a phase mask, for example, optionally after conversion of the hologram 110 into a representation suitable for this type of spiral plate 115.

In order then to generate a physical vortex, the spiral plate 115 configured in this way is irradiated with a physical particle wave 140. Preferably, the properties (angle of incidence, wavelength, intensity, etc.) of said particle wave correspond as far as possible to the properties of the reference wave 120 used for generating the hologram 110, in order that the vortex 130 "hidden in the hologram" can be physically generated or reproduced as faithfully as possible in terms of shape.

It is often the case here, depending on the exact configuration of the spiral plate 115, that at least one pair of particle beam vortices 150 and 155 is generated which have the numbers of turns +1 and −1, i.e. numbers of turns having the same absolute value but different signs. It is even possible to generate a plurality of such pairs, in accordance with the different orders of diffraction—at least with the use of a binary amplitude plate as shown in FIG. 1B—although the intensity will generally decrease as the number of turns/order of diffraction increases, and individual numbers of turns/orders of diffraction (e.g., the even-numbered ones) may also be suppressed or extinguished by interference effects. Furthermore, the zero order of diffraction may also be present with a certain intensity in transmission, depending on the exact structure of the spiral plate 115.

This is indicated in FIG. 1C, in which an intensity profile 102 of the innermost orders of diffraction is demonstrated schematically. In the center, where l=0, the intensity of the primary beam passing through is indicated at reference 160. Shown on the right and left of that are the two vortices 150 and 155 from FIG. 1B, which correspond to the first order of diffraction, and the expected value of which for the angular momentum component in the direction of propagation is not equal to zero, i.e. $\langle L_z \rangle \neq 0$ for the vortices 150 and 155.

As is shown in FIG. 1C, a special feature of such particle beam vortices with non-vanishing angular momentum is that their intensity distribution at the beam center has a pronounced $\langle L_z \rangle \neq 0$ minimum. This can be particularly advantageous for analyzing/processing the mask, as already explained above, since this "intrinsic focusing" of the vortex can be used to increase the positional accuracy and the resolution capability of the method.

FIG. 2 shows schematically in section some components of an apparatus 200 for analyzing of a mask 20, on which the method described herein including the use of at least one particle beam vortex can proceed. The apparatus 200 allows in particular a registration measurement of the position of a structure on the mask 20 in order to compare this for example with a nominal position predefined by a mask design.

However, the apparatus 200 can in principle also be used for the processing and/or production of the mask 20, or it can be used even more generally for analyzing and/or processing of a different kind of sample (i.e., not necessarily a lithography mask). Such a sample can in principle be an arbitrary microstructured component. In this regard, the sample to be examined and/or to be produced or to be processed can be, for example, a transmissive or a reflective photomask or a template for nanoimprint technology. The transmissive or reflective photomask can furthermore comprise all types of photomasks, for instance binary masks, phase-shifting masks, MoSi (molybdenum silicide) masks, or masks for a double or multiple exposure.

Hereinafter, however, the term referred to will always be the mask 20, for the sake of simplicity.

A modified scanning beam microscope 210 (SBM for short) is arranged in a vacuum chamber 202. In FIG. 2, the modified scanning beam microscope 210 is embodied in the form of a "scanning electron microscope") (SEM for short). The use of electrons has the advantage that they substantially do not damage the mask 20. However, it is also possible to use an ion beam, an atomic beam or a molecular beam (not illustrated in FIG. 2) in the apparatus 200.

Hereinafter, however, the term referred to will always be the SEM 210, for the sake of simplicity.

The SEM 210 is composed of a particle gun 205 and a column 215, in which a beam optical unit 220, for instance in the form of an electron optical unit 220, of the SEM 210 is arranged. The particle gun 205 generates a particle beam, that is to say here an electron beam, and the electron or beam optical unit 220 focusses and initially shapes the particle beam thus generated. The beam (pre-)shaped in this way is referred to hereinafter as primary beam 225.

Unlike a conventional SEM, however, the apparatus 200 comprises means for generating at least one particle beam vortex 2100, which then is guided by suitable means in the direction of the mask 20 and is used there for the analysis of the mask 20, e.g. for the registration measurement of a mask structure. The particle beam vortex 2100 impinges on the mask 20 at the measurement point 235.

The means for generating the particle beam vortex 2100 here comprise a spiral plate 2200, through which the primary beam 225 previously shaped by the electron or beam optical unit 220 of the SEM 210 passes. The spiral plate 2200 can be introduced into the particle beam in an adjustable manner, such that a dynamic adjustment of the spiral plate 2200 is possible.

For this purpose, the spiral plate 2200 can be connected to suitable (mechanical) means 2300, which can alter and readjust the position and/or orientation of the spiral plate 2200 for example relative to the primary beam 225 and/or the axis of the column 215 of the SEM 210.

Furthermore, means 2400 allowing a position and/or an orientation of the spiral plate 2200 to be determined can additionally be comprised. Even more generally, the apparatus 200 can comprise means 2450 which can determine one or more correction variables, and the means 2400 and/or 2450 can be connected to the means 2300 or can couple to the latter in order thus to influence and/or to control the dynamic adjustment of the spiral plate 2200. The means 2450 which determine the one or more correction variables can for example comprise or be connected to the interferometer 270, discussed in even more specific detail below, or the detector 2170, on which a second vortex 2150 can impinge, e.g., as stability reference and/or position reference (cf. below).

In this way, the adjustment of the spiral plate 2200 can comprise, e.g., a tracking of the spiral plate 2200, a correction of a distortion aberration and/or a decoupling of a constant drift.

In this case, as outlined in association with FIGS. 1A to 1C, the spiral plate 2200 can operate according to the principle of holographic stops, and it can either comprise an amplitude mask or be embodied as such, or comprise a phase mask or be embodied as such.

It is furthermore possible, as indicated by the dashed arrow 2150, for not just one vortex 2100 to be generated by use of the spiral plate 2200, but rather a pair of vortices, 2100 and 2150. In this case, the angular relationships are not necessarily represented faithfully in FIG. 2, but rather have been chosen as they are in order to foster clarity and comprehensibility of FIG. 2. In this case, the first particle beam vortex 2100 of the pair is used for analyzing (and/or for processing) of the mask 20, while the second particle beam vortex 2150 of the pair can be guided, e.g., to a detector 2170. In this way, the second particle beam vortex 2150 can function, for example, as stability reference and/or position reference. This is possible particularly if there is a certain correlation between the two vortices 2100 and 2150, e.g. if they are both generated from the one primary beam 225 by use of the spiral plate 2200 and, as described in association with FIGS. 1B and 1C, form a pair with numbers of turns (+l, −l) having the same absolute value but different signs. In order to utilize the data ascertained by the detector 2170, the latter, as already mentioned above, can e.g. be connected to the means 2300 or supply data thereto in order to influence or to control the adjustment of the spiral plate 2200.

Besides the use of the apparatus 200 for the registration measurement, e.g. in the context of process control during mask production, the apparatus 200 can also serve for the processing of the mask 20, e.g. in an etching or deposition process induced by the processing vortex 2100, in order to thus to write a structure to the mask 20 and/or to correct an existing structure.

Returning to the general set-up of the apparatus 200, the mask 20 can be arranged on a sample stage 230 or a sample holder 230. A sample stage 230 is also known as a "stage" in the art. As symbolized by the arrows in FIG. 2, the sample stage 230 can be moved in three spatial directions relative to the column 215 of the SEM 210, for example by way of micro-manipulators that are not illustrated in FIG. 2. Furthermore, the sample stage 230 can comprise sensors that are designed to detect the movement of the sample stage 230 relative to the column 215 of the scanning beam microscope 210 in the three spatial directions. Moreover, the sample stage 230 can be embodied to be rotatable about one or more axes (not illustrated in FIG. 2). Like the translational movements, the rotational movements of the sample stage 230 can be monitored by sensors. The sensors, which are not reproduced in FIG. 2, can be embodied in the form of interferometers, for example.

The apparatus 200 can furthermore comprise one or more scanning probe microscopes, for example in the form of an "atomic force microscope" (AFM for short) (not shown in FIG. 2), which can likewise be used for analyzing and/or processing of the mask 20.

A detector 245 (or a plurality of detectors), which can be arranged in the column 215 of the SEM 210, can convert the secondary electrons generated by the vortex 2100 at the measurement point 235 and/or electrons backscattered from the mask 20 into an electrical measurement signal and can forward the latter to an evaluation unit 286 of a computer system 280 of the apparatus 200. The detector 245 can contain a filter or a filter system in order to discriminate the electrons in terms of energy and/or solid angle (not reproduced in FIG. 2).

The SEM 210 of the apparatus 200 can furthermore comprise a detector 255 for detecting the photons generated by the incident vortex 2100 at the first measurement point 235. The detector 255 can, for example, spectrally resolve the energy spectrum of the generated photons and thereby allow conclusions to be drawn concerning the composition of the surface 25 or layers near the surface of the mask 20.

Moreover, the SEM 210 can comprise an ion source 265 that provides low-energy ions in the region of the first measurement point 235 for the case where the mask 20 is electrically insulating or has an electrically insulating surface layer.

At the lower end of the column 215, at which the vortex 2100 emerges from the column 215, a first reference object 240 can furthermore be secured to the column 215. The apparatus 200 can additionally comprise a distance measuring device 270, which can be embodied, e.g., as an interferometer 270, in more specific detail as a differential interferometer. The interferometer 270 can comprise a laser as a light source. The interferometer 270 can direct a first light beam 273 at a reflection unit 260 of the first reference element 240 and the reflection unit 260 of the first reference element 240 can reflect the impinging light beam 273 back to the interferometer 270. The interferometer 270 can additionally direct a second light beam 276 at a second reference object 250, which can be, e.g., a side surface of the mask 20, as shown in FIG. 2. In order to increase the reflectivity of the second reference object 250, the second reference object 250 can comprise a reflection apparatus 258, e.g. a specularly reflective layer on the side surface of the mask 20, which is intended to reflect the light beam 276. The interferometer 270 can measure a relative change in position or location of the first reference object 240 and the second reference object 250 with respect to one another.

Furthermore, the second reference object 250 can comprise a second reflection apparatus, which is not reproduced in FIG. 2, and which is aligned in the direction of the beam axis of the electron beam vortex 2100. With the aid of an interferometer, for example, which is likewise not illustrated in FIG. 2, it is possible to measure the distance between the first reference object 240 and the second reference object 250 in the beam direction. As a result, it is possible to ascertain the distance between the first reference object 240 and the top side 25 of the mask 20.

The particle beam vortex 2100 can be used, as already mentioned, to measure structures and/or markers present on the mask 20. If the mask 20 has an internal coordinate system in the form of different markers, it is possible to ascertain the absolute position of, for instance, a structure element on the mask 20.

In this case, the first reference object 240 can be used to determine a change in location of the vortex 2100 relative to the first reference object 240. In addition, the distance measuring device 270 can measure a change in position of the first reference object 240, i.e. the column 215 of the SEM 210, relative to the second reference object 250, i.e. the mask surface 25. Ultimately, a change in the rest position of the vortex 2100 in relation to the mask 20 is thus detected. This change can be transferred back, e.g., to the means 2300 in order thus to readjust the spiral plate 2200 and to compensate for undesired position fluctuations.

In this case, such a use of the distance measuring device 270 to control or to influence the adjustment of the spiral plate 2200 can be effected in addition or as an alternative to the above-described use of a second vortex 2150 as position/stability reference. By way of example, the data from both sources can be compared with one another or averaged, etc.

The apparatus 200 can additionally be extended by further distance measuring devices of this type (not shown in FIG. 2), which preferably have a different orientation (e.g., rotated by an angle of 90° relative to one another about the beam axis of the vortex 2100) compared with the distance measuring device 270 discussed here and shown in FIG. 2, and they can likewise be connected to the means 2300 and thus influence or control the adjustment of the spiral plate 2200.

Furthermore, it is possible to use two distance measuring apparatuses 270 for each direction, said distance measuring apparatuses preferably being arranged on a straight line on both sides of the first reference object 240 or the second reference object 250. This firstly makes it possible to easily determine a change in length or distortion of the first reference object 240. Secondly, this also facilitates the analysis of large masks 20 having a very uneven surface. At least one of the two distance measuring devices 270 for a direction should not be shaded by the mask 20.

In the apparatuses 200 shown in FIG. 2, the distance measuring device 270 is embodied as an interferometer. It is also possible to implement the distance measuring device 270 in the form of a position sensor. By way of example, a position sensor can be implemented as a potentiometer transducer or a strain gauge. However, a position sensor can also be embodied as a resistive, capacitive and/or as a magneto-inductive distance sensor and/or as a linear encoder system.

The apparatus 200 can furthermore include a computer system 280.

The computer system 280 can comprise a scanning unit 282, which can scan the electron beam vortex 2100 over the mask 20 and/or at least partly over the first reference object 240. In this case, the scanning unit can be connected to the means 2300 for adjusting the spiral plate 2200 (such a connection is not shown in FIG. 2 and can bring about or contribute to the scanning process by way of a change in the position/location of the spiral plate 2200. However, the actual scanning process can also be brought about by other components of the apparatus 200, e.g. by a change in the position and orientation of the primary beam 225 impinging on the spiral plate 2200 and/or by movements of the stage 230, wherein the means 2300 are used only for the fine adjustment of the vortex 2100.

Furthermore, the computer system 280 can comprise a setting unit 284 for setting and controlling the various parameters of the SEM 210 of the apparatus 200.

Moreover, the computer system 280 can comprise an evaluation unit 286, which can, e.g., analyze the measurement signals from the detectors 245, 255 or else 2170 and generate an image therefrom, which image can be displayed on a display 290. The region in which the scanning unit 282 can scan the vortex 2100 over the mask 20 and/or the reference object 240 can be represented on the screen 290 of the computer system 280 and is therefore called image region or FOV (stands for "field of view") of the SEM 210. In particular, the evaluation unit 286 can be designed to determine from the measurement data of the detector 245, which can include the signals from the mask 20 and the first reference object 240, linear and non-linear disturbances of the scan region which can occur during the scanning of the vortex 2100 by the scanning unit 282. The evaluation unit 286 can additionally contain one or more algorithms that make it possible to correct the detected disturbances during the representation of the measurement data of the detector 245 on the screen 290 of the computer system 280. The algorithms of the evaluation unit can be implemented in hardware, software or a combination thereof.

The evaluation unit 286 can likewise process the measurement signals of the distance measuring device 270 or of the interferometer 270 and/or of the means 2400, 2450 and/or of the detector 2170 and represent them graphically and/or numerically on the screen 290. This can be used for example for control or tracing of the adjustment measures with regard to the spiral plate 2200. To that end, the evaluation unit 286 can include one or more algorithms designed to generate image data from the measurement signals.

Furthermore, the evaluation unit 286 can be designed, e.g., also to take account of the measurement data of the distance measuring device 270, besides the measurement data of the detector 245, when representing the element sensed by the scanning unit 282 on the screen 290.

The computer system 280 and/or the evaluation unit 286 can include a memory (not illustrated in FIG. 2), preferably a non-volatile memory, which stores one or more models of electric charging for various mask types. The evaluation unit 286 can be designed to calculate electrostatic charging of a mask 20 from the measurement data, e.g., of the detector 245 and on the basis of a model of electric charging. Furthermore, the evaluation unit 286 can be designed to take account of the electrostatic charging of the mask 20 when representing the scan region on the screen 290. Moreover, the evaluation unit 286 can cause the computer system 280 at least partly to compensate for the electric charging by use of local irradiation with the vortex 2100 and/or with low-energy ions from the ion source 265.

As indicated in FIG. 2, the evaluation unit 286 can be integrated into the computer system 280. However, it is also possible to embody the evaluation unit 286 as an independent unit within or outside the apparatus 200. In particular, the evaluation unit 286 can be designed to carry out some of its tasks by use of a dedicated hardware implementation.

Finally, the computer system 280 can contain a displacement unit 288, which can move the sample stage 230 in one, two or three spatial directions by applying electrical signals to micro-manipulators.

The computer system 280 can be integrated into the apparatus 200 or can be embodied as an independent device (not shown in FIG. 2). The computer system 280 can be embodied using hardware, software, firmware or a combination.

Unlike what is illustrated in FIG. 2, the SEM 210 of the apparatus 200 can additionally comprise a multi-beam scanning beam microscope, which can simultaneously direct a plurality of particle beam vortices and/or particle beams without vortex character at the mask 20 (not illustrated in FIG. 2). A multi-beam scanning beam microscope can comprise a detector or a detector arrangement, which can detect in parallel the secondary particles generated by the individual beams. Moreover, the evaluation unit 286 of a multi-beam scanning beam microscope can be designed to combine the partial images generated from the secondary particles of the individual beams to form an overall image. By way of example, in such an apparatus, a vortex beam can be combined with a non-vortex beam or it is possible to switch between both possibilities in order to afford the advantages of both possibilities.

Figure 3:
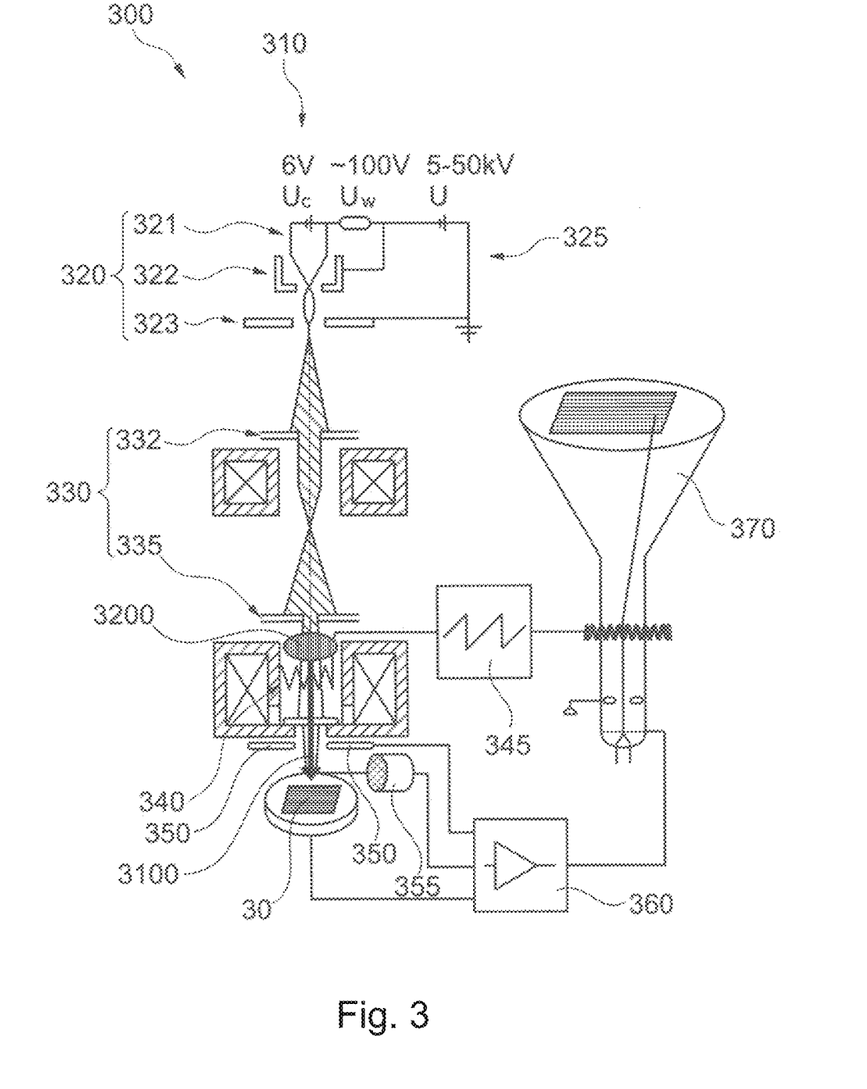
FIG. 3 schematically shows in section some components of a further apparatus according to the present invention for analyzing a mask.

FIG. 3 shows schematically in section some components of a further apparatus 300 for the analysis of a sample 30, in particular of a lithography mask (e.g., an EUV mask), on which the method described herein including the use of at least one particle beam vortex can proceed. The apparatus 300 is once again based on an SEM 310 and allows, e.g., a registration measurement of the position of a structure on the sample 30, in order to compare this with a predefined nominal position, for example.

In a manner completely analogous to the apparatus 200 and respectively the mask 20, the apparatus 300 and respectively the sample 30 are not restricted to this, however, rather the further possibilities and application options already mentioned above are applicable in this case as well. For the sake of conciseness, these variants will not be mentioned again here, and instead reference is made to the corresponding explanations concerning the apparatus 200 and the mask 20 above, which analogously retain their validity for the apparatus 300 and respectively the sample 30 as well. In addition, as above, hereinafter the term referred to will always be the mask 30, for the sake of simplicity.

The apparatus comprises an SEM 310 having a microscope column, which in turn comprises a beam generating unit 320 and a beam optical unit 330. The beam generating unit 320 shown here in this case comprises a cathode 321, a Wehnelt cylinder 322 and an anode 323, which are interconnected with one another and with earth by way of a suitable electrical circuit 325. In the case shown here, the beam optical unit 330 comprises, inter alia, an optical condenser 322 and a beam shaping lens 335. The electron beam emanating from said lens 335 is again referred to hereinafter as "primary beam."

Said primary beam impinges on a spiral plate 3200, which generates at least one electron beam vortex 3100 used for analyzing (and/or processing) of the mask. After being generated, the vortex 3100 for this purpose passes through a scanning unit 340, which is connected to a suitable control unit 345 and ensures that the vortex 3100 is scanned over the surface of the mask 30 for analysis purposes. That is to say that, in the embodiment shown here, the spiral plate 3200 is arranged between the beam shaping lens 335 and the scanning unit 340.

The analysis of the mask 30 is effected, e.g., in such a way that particles, in particular electrons, backscattered from the mask are captured by way of one or more detectors 350 or secondary electrons generated by the electron bombardment are recorded by one or more detectors 355, and the data of these detectors are used for the analysis in a manner known per se.

Furthermore, the detectors 350 and 355 and the stage of the SEM 310 can be connected to a video amplifier 360, which supplies an output signal to a representation unit, e.g. a screen 370, said output signal being used for representing the measurement and for analyzing results. For this purpose, the screen 370 can furthermore also be connected to the control unit 345, which controls the scanning process in order thus to synchronize the various signals.

Although not explicitly shown and discussed, the possibilities and modification and extension options already explained above are also applicable to the vortex 3100 and the spiral plate 3200, e.g. the inclusion of means for the dynamic adjustment of the spiral plate 3200, optionally coupled to means for measuring one or more correction variables and/or the position of the spiral plate 3200, the possibility for generating and using a vortex pair, etc. Therefore, reference is made in particular to the explanations in the general part of the description and the explanations concerning FIG. 2, all of which can also be applied to the apparatus 300 in FIG. 3, provided that there is no obstacle to that owing to technical or physical laws or reasons.

In some implementations, the computer system 280 (FIG. 2) or other data processing modules can include one or more data processors for processing data, one or more storage devices for storing data, such as one or more databases, and/or one or more computer programs including instructions that when executed by the computer system causes the computer system to carry out the computations or processes described above. In some implementations, the computer system can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the computer system 280 can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the data processing (e.g., for analyzing a mask) described above can be implemented using software for execution on one or more mobile computing devices, one or more local computing devices, one or more remote computing devices, and/or one or more cloud computing servers. For instance, the software forms procedures in one or more computer programs that execute on one or more programmed or programmable computer systems, either in the mobile computing devices, local computing devices, or remote computing systems (which can be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software can be provided on a medium, such as a CD-ROM, DVD-ROM, Blu-ray disc, hard drive, or flash drive, readable by a general or special purpose programmable computer or delivered (encoded in a propagated signal) over a network to the computer where it is executed. The functions can be performed on a special purpose computer, or using special-purpose hardware, such as coprocessors. The software can be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system can also be considered to be implemented as a computer-readable storage medium, configured with a computer program, where the storage medium so configured causes a computer system to operate in a specific and predefined manner to perform the functions described herein.

While this specification contains many implementation details, these should not be construed as limitations on the scope of the invention or of what can be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. The separation of various system components in the embodiments described above should not be understood as requiring such separation in all embodiments. Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. In addition, the actions recited in the claims can be performed in a different order and still achieve desirable results.

What is claimed is:

1. A method for analyzing and/or processing of a mask for lithography, the method comprising:
    1a: generating at least one particle beam vortex, comprising a particle beam passing through a spiral plate;
    1b: using the particle beam vortex for analyzing and/or processing of the mask; and
    1c. determining a position of the spiral plate.
2. The method of claim 1, wherein the spiral plate is introduced into the particle beam in an adjustable manner.
3. The method of claim 2, further comprising a dynamic adjustment of the spiral plate.
4. The method of claim 3, wherein the adjustment of the spiral plate is coupled to one or more correction variables.
5. The method of claim 3, wherein the adjustment of the spiral plate comprises tracking the spiral plate.
6. The method of claim 3, wherein the adjustment of the spiral plate comprises a correction of a distortion aberration.
7. The method of claim 3, wherein the adjustment of the spiral plate comprises a decoupling of a constant drift.
8. The method of claim 1, wherein the spiral plate operates according to the principle of holographic stops.
9. The method of claim 1, wherein the spiral plate comprises an amplitude mask or is embodied as such.
10. The method of claim 1, wherein the spiral plate comprises a phase mask or is embodied as such.
11. The method of claim 1, further comprising providing the particle beam by use of a scanning beam microscope.
12. The method of claim 1, wherein step 1a. comprises generating at least one pair of particle beam vortices, wherein a first particle beam vortex of the pair is used for analyzing and/or processing of the mask in step 1b., and wherein the other, second particle beam vortex of the pair is guided to a detector.
13. The method of claim 12, further comprising using the second particle beam vortex of the pair as stability reference and/or position reference.

14. The method of claim 12, wherein the two particle beam vortices form a pair with numbers of turns (1, −1) having the same absolute value but different signs.
15. The method of claim 1, wherein the particle beam vortex is used in step 1b. for a measurement in which a deviation of a position of a structure on the mask from an intended position of the structure on the mask is ascertained.
16. The method of claim 15, wherein the method serves for process control during mask production.
17. The method of claim 1, wherein the particle beam vortex is used in step 1b. for particle beam writing of a structure to the mask.
18. The method of claim 1, wherein the particles are electrons.
19. A computer program comprising instructions which, upon execution, cause an apparatus for analyzing and/or processing of a lithography mask to carry out the steps of the method of claim 1.
20. An apparatus for analyzing and/or processing of a mask for lithography, the apparatus comprising:
    22a. means for generating at least one particle beam vortex, wherein generating the at least one particle beam vortex comprises a particle beam passing through a spiral plate;
    22b. means for using the particle beam vortex for analyzing and/or processing of the mask; and
    22c. means for determining a position of the spiral plate.
21. The apparatus of claim 20, wherein the means for generating at least one particle beam vortex comprise a spiral plate, which is introduced into a particle beam.
22. The apparatus of claim 21, further comprising means for dynamic adjustment of the spiral plate.
23. The apparatus of claim 22, furthermore comprising means for ascertaining one or more correction variables, wherein the means for dynamic adjustment of the spiral plate are coupled to the means for ascertaining.
24. The apparatus of claim 20,
    wherein the means for generating at least one particle beam vortex comprise means for generating at least one pair of particle beam vortices,
    wherein a first particle beam vortex of the pair of particle beam vortices is used by the means for using the particle beam vortex for analyzing and/or processing of the mask, and
    wherein the apparatus further comprises means for using the other, second particle beam vortex of the pair of particle beam vortices as stability reference and/or position reference.
25. The apparatus of claim 20, wherein the means for analyzing and/or processing of the mask comprise means for a measurement in which a deviation of a position of a structure on the mask from an intended position of the structure on the mask is ascertained.
26. The apparatus of claim 20, wherein the means for analyzing and/or processing of the mask comprise means for particle beam writing of a structure to the mask.
27. The apparatus of claim 20, wherein the particles are electrons, and wherein the apparatus comprises a scanning electron microscope or is embodied as such.
28. The apparatus of claim 20, wherein the apparatus is configured to generate the at least one particle beam vortex; and at least one of analyze or process the mask by using the at least one particle beam vortex.

* * * * *

UNITED STATES PATENT AND TRADEMARK OFFICE
CERTIFICATE OF CORRECTION

PATENT NO. : 12,105,415 B2
APPLICATION NO. : 17/398596
DATED : October 1, 2024
INVENTOR(S) : Oliver Jäckel Page 1 of 1

It is certified that error appears in the above-identified patent and that said Letters Patent is hereby corrected as shown below:

In the Specification

<u>Column 13</u>
Line 48, delete ") (SEM for short)" and insert -- (SEM for short) --

<u>Column 17</u>
Line 2, delete "FIG. 2" and insert -- FIG. 2) --

In the Claims

<u>Column 21</u>
Line 35 (approx.), in Claim 1, delete "1c." and insert -- 1c: --

Signed and Sealed this
Nineteenth Day of November, 2024

Katherine Kelly Vidal
*Director of the United States Patent and Trademark Office*